US008129828B2

(12) United States Patent
Maeda

(10) Patent No.: US 8,129,828 B2
(45) Date of Patent: Mar. 6, 2012

(54) WIRING SUBSTRATE WITH REINFORCEMENT

(75) Inventor: Shinnosuke Maeda, Aichi (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 127 days.

(21) Appl. No.: 12/568,185

(22) Filed: Sep. 28, 2009

(65) Prior Publication Data

US 2010/0078786 A1   Apr. 1, 2010

(30) Foreign Application Priority Data

Sep. 29, 2008   (JP) .................................. 2008-249548

(51) Int. Cl.
*H01L 23/02*   (2006.01)
(52) U.S. Cl. ........ 257/678; 257/702; 257/701; 257/759; 257/E23.18; 174/255
(58) Field of Classification Search .................. 257/678, 257/702, 701, 759, E23.18; 174/255
See application file for complete search history.

(56) References Cited

U.S. PATENT DOCUMENTS

| 6,613,986 | B1* | 9/2003 | Hirose et al. .................. 174/255 |
| 7,728,440 | B2* | 6/2010 | Honda .......................... 257/778 |
| 2004/0053489 | A1* | 3/2004 | Kata et al. .................... 438/622 |
| 2006/0214281 | A1* | 9/2006 | Sir ................................ 257/701 |

FOREIGN PATENT DOCUMENTS

| JP | 2002-26171 | 1/2002 |
| JP | 2002-26500 | 1/2002 |

* cited by examiner

*Primary Examiner* — Junghwa M Im
(74) *Attorney, Agent, or Firm* — Stites & Harbison PLLC; Jeffrey A. Haeberlin; Nicolo Davidson

(57) ABSTRACT

A wiring substrate assembly includes a resin wiring substrate and a reinforcement member. The resin wiring substrate does not have a core substrate, and includes a substrate main surface, a substrate back surface, a laminate structure comprised of resin insulation layers and conductive layers, and connection terminals disposed on the substrate main surface, to which a chip component is connectable. The reinforcement member is bonded to the substrate main surface and defines an opening portion extending through the reinforcement member so as to expose the main-surface-side connection terminals. The reinforcement member comprises a composite material including a resin material containing an inorganic material.

20 Claims, 13 Drawing Sheets

WIRING SUBSTRATE WITH REINFORCEMENT

CROSS-REFERENCE TO RELATED APPLICATIONS

This application is based on and claims priority to Japanese patent Application No. 2008-249548 filed Sep. 29, 2008, which is hereby incorporated herein by reference in its entirety.

BACKGROUND OF THE INVENTION

1. Technical Field

The present invention relates to a wiring substrate which has a reinforcement for preventing warpage of a resin wiring substrate.

2. Description of Related Art

In recent years, semiconductor integrated circuit devices (IC chips) used as, for example, microprocessors of computers have greatly advanced in operation speed and functionality. In association with such advancement, the number of terminals tend to increase, and the pitch of terminals tends to become narrower. Generally, a large number of terminals are densely arrayed on the bottom surface of an IC chip. Such a group of terminals are flip-chip-connected to a group of terminals on a motherboard. However, since there is a great difference in the pitch of terminals between the group of terminals on the IC chip and the group of terminals on the motherboard, difficulty is encountered in connecting the IC chip directly onto the motherboard. Thus, usually, the IC chip is mounted on an IC-chip-mounting wiring substrate, thereby yielding a semiconductor package. Then, the semiconductor package is mounted on the motherboard (refer to, for example, Japanese Patent Application Laid-open (kokai) No. 2002-26500 (FIG. 1, etc.).

An IC chip is generally formed from a semiconductor material (for example, silicon) having a thermal expansion coefficient of about 2.0 ppm/° C. to 5.0 ppm/° C. By contrast, in many cases, an IC-chip-mounting wiring substrate is a resin wiring substrate, which is formed from a resin material or the like whose thermal expansion coefficient is considerably higher than that of the semiconductor material. A practicalized example of the resin wiring substrate is configured such that a build-up layer is formed on the front and back surfaces of a core substrate. The core substrate used in the resin wiring substrate is, for example, a resin substrate (glass epoxy substrate) formed by impregnating reinforcement fiber with resin. Through utilization of rigidity of the core substrate, resin insulation layers and conductive layers are alternately laminated on the front and back surfaces of the core substrate, thereby forming respective build-up layers. In the resin wiring substrate, the core substrate serves as a reinforcement and is formed very thick as compared with the build-up layers. The core substrate has conductor lines (specifically, through-hole conductors, etc.) extending therethrough for electrical connection between the build-up layers formed on the front and back surfaces.

In recent years, in association with implementation of high operation speeds of semiconductor integrated circuit devices, high-frequency band signals have been used. In this case, the conductor lines which extend through the core substrate serve as sources of high inductance, leading to a transmission loss of the high-frequency band signals and a circuitry malfunction. Thus, implementation of high operation speed has been hindered. In order to solve this problem, a resin wiring substrate having no core substrate is proposed (refer to, for example, Japanese Patent Application Laid-open (kokai) No. 2002-26171 (FIG. 5, etc.). This substrate does not use a core substrate, which is relatively thick, thereby reducing the overall wiring length. Thus, the transmission loss of the high-frequency band signals is lowered, whereby the semiconductor integrated circuit devices can be operated at high operation speeds.

However, the elimination of a core substrate renders the resin wiring substrate thin, so that a drop in rigidity of the resin wiring substrate is unavoidable. In this case, when solder used for the flip chip connection is cooled, under the influence of thermal stress stemming from a difference in a thermal expansion coefficient of a chip material and a thermal expansion coefficient of a substrate material, the resin wiring substrate is apt to warp toward a side on which the chip is mounted. As a result, cracking is apt to occur in a chip bond zone, so that an open circuit is apt to arise. That is, the formation of a semiconductor package by use of the above-mentioned IC chip results in a failure to achieve high yield and high reliability.

In order to solve the above-mentioned problem, there is proposed a semiconductor package 100 (see FIGS. 18 and 19) configured such that an annular metal stiffener 105 is attached to one side (a substrate main surface 102 or a substrate back surface 103) of a resin wiring substrate 101. The metal stiffener 105 restrains warpage of the resin wiring substrate 101, whereby cracking is unlikely to occur in a bond zone between the resin wiring substrate 101 and an IC chip 106, thereby increasing yield and improving reliability.

However, the metal stiffener 105 is bonded to the substrate main surface 102 of the resin wiring substrate 101 via an adhesive 104. Specifically, the metal stiffener 105 is bonded to the substrate main surface 102 of the resin wiring substrate 101 through solidification of the adhesive 104 effected by heat treatment (curing) at about 150° C. Thus, at the time of cooling after the heat treatment, under the influence of thermal stress stemming from difference in thermal expansion coefficient between a stiffener material and a substrate material, the resin wiring substrate 101 (specifically, its region exposed from an opening portion of the metal stiffener 105) is apt to warp.

BRIEF SUMMARY OF THE INVENTION

The present invention has been conceived in view of the above-mentioned problems, and an object of the invention is to provide a wiring substrate with a reinforcement member (a "reinforcement") which exhibits improved reliability through prevention of warpage of a resin wiring substrate at the time the reinforcement is bonded to the resin wiring substrate.

Means for solving the above-mentioned problems is a wiring substrate with a reinforcement comprising a resin wiring substrate and a reinforcement. The resin wiring substrate does not have a core substrate, and has a substrate main surface and a substrate back surface, a laminate structure of resin insulation layers and conductive layers, and a plurality of connection terminals ("main-surface-side connection terminals") which are disposed on the substrate main surface and to which a chip component is connectable. The reinforcement is bonded to the substrate main surface and defines an opening portion extending through the reinforcement so as to expose the plurality of main-surface-side connection terminals therefrom. In the wiring substrate with a reinforcement, the reinforcement comprises a composite material including a resin material containing an inorganic material.

Thus, the reinforcement is formed of a composite material prepared such that a resin material contains an inorganic material. Therefore, the thermal expansion coefficient of the reinforcement can be brought close to that of the resin wiring substrate, which is formed of a resin material as is the reinforcement. Accordingly, as compared with the case of a metal reinforcement, the difference between the thermal expansion coefficient of the reinforcement and the thermal expansion coefficient of the resin wiring substrate is reduced, whereby, for example, at the time of bonding of the reinforcement (at the time of cooling after heat treatment), warpage of the resin wiring substrate is restrained. Particularly, when the difference in thermal expansion coefficient between the reinforcement and the resin wiring substrate is 0 ppm/° C. to 10.0 ppm/° C. inclusive, warpage of the resin wiring substrate is more reliably restrained. As a result, the occurrence of a defect caused by warpage of the resin wiring substrate is prevented, so that the reliability of the wiring substrate with a reinforcement is improved.

Herein, the "thermal expansion coefficient" of the reinforcement and the resin wiring substrate means that in a direction (XY direction) perpendicular to a thickness direction (Z direction) and is a value obtained by measurement in a temperature range of 0° C. to 100° C. inclusive with a thermomechanical analyzer. TMA, or thermomechanical analysis, is specified in, for example, JPCA-BU01.

The resin wiring substrate used to form the above-mentioned wiring substrate with a reinforcement can be selected as appropriate in consideration of cost, processability, insulation quality, mechanical strength, etc. The resin wiring substrate employed does not have a core substrate, and has a substrate main surface and a substrate back surface, a laminate structure of resin insulation layers and conductive layers, and a plurality of main-surface-side connection terminals which are disposed on the substrate main surface and to which a chip component is connectable. That is, the resin wiring substrate is a coreless wiring substrate which is formed primarily of the same resin insulation layers and in which the conductive layers are connected to one another only by means of vias (via conductors and via holes) whose diameters increase in the same direction.

The resin insulation layers can be selected as appropriate in consideration of insulation quality, heat resistance, humidity resistance, etc. Preferred examples of a polymeric material used to form the resin insulation layers include thermosetting resins, such as epoxy resin, phenol resin, urethane resin, silicone resin, and polyimide resin, and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin.

In order to form the via conductors for interconnections between the conductive layers, the resin insulation layers may have via holes formed therein beforehand. For example, further connection terminals ("back-surface-side connection terminals") for connection to a motherboard may be disposed on the substrate back surface, and the diameter of each of the vias (via conductors and via holes) provided in the resin insulation layers increases toward the substrate back surface.

The conductive layers and the main-surface-side connection terminals are made primarily of copper and are formed by a known process, such as a subtractive process, a semi-additive process, or a fully-additive process. Specifically, for example, etching of a copper foil, electroless copper plating, or copper electroplating is applied. Also, the conductive layer and the main-surface-side connection terminals can be formed by forming a thin film by sputtering, CVD, or a like process, followed by etching, or through application of conductive paste by printing.

Preferred examples of the aforementioned chip component include a capacitor, a semiconductor integrated circuit device (IC chip), and a micro-electro-mechanical system (MEMS) device fabricated in a semiconductor fabrication process. Examples of the IC chip include a dynamic random access memory (DRAM) and a static random access memory (SRAM). Herein, the "semiconductor integrated circuit device" refers mainly to a microprocessor of a computer, or a like device. Examples of the chip component include a chip transistor, a chip diode, a chip resistor, a chip capacitor, and a chip coil.

Preferably, a reinforcement used to partially constitute the wiring substrate with a reinforcement is higher in rigidity than a resin material used to partially constitute the resin wiring substrate. For example, preferably, the reinforcement is higher in Young's modulus than the resin material used to partially constitute the resin wiring substrate. This is because, through impartment of high rigidity to the reinforcement itself, surface-bonding the reinforcement to the resin wiring substrate can impart high rigidity to the resin wiring substrate, thereby further enhancing resistance to externally applied stress. In the case of a reinforcement having high rigidity, even when the thickness of the reinforcement is reduced, the reinforcement can impart sufficiently high rigidity to the resin wiring substrate, so that the implementation of a thin wiring substrate with a reinforcement is not hindered.

Preferred examples of a resin material used to partially constitute the above-mentioned reinforcement include epoxy resin, polybutene resin, polyamide resin, polybutylene terephthalate resin, polyphenylene sulfide resin, polyimide resin, bismaleimide triazine resin, polycarbonate resin, polyphenylene ether resin, and acrylonitrile butadiene styrene copolymer (ABS resin). Additionally, there may be used a composite material consisting of any one of these resins, and glass fiber (glass woven fabric or glass nonwoven fabric) or organic fiber, such as polyamide fiber.

Preferred examples of an inorganic material used to partially constitute the reinforcement include a ceramic material, a metal material, and a glass material. Examples of the ceramic material include low-temperature-fired materials, such as alumina, glass-ceramic, and crystallized glass; aluminum nitride; silicon carbide; and silicon nitride. Examples of the metal material include iron, gold, silver, copper, copper alloy, iron-nickel alloy, silicon, and gallium arsenide. Use of a metal material as the inorganic material enables the reinforcement to serve as a shield against static electricity and against electromagnetic waves from a noise source. The inorganic material may be inorganic particles or a sheet material of inorganic fiber; however, a sheet material of inorganic fiber is preferred. Use of such a sheet material imparts higher rigidity to the reinforcement itself. Examples of inorganic fiber include glass fiber (glass woven fabric or glass nonwoven fabric), polyamide fiber, metal fiber, and paper.

The reinforcement is bonded to the substrate main surface. The shape or the like of the reinforcement is not particularly limited, but is arbitrary. However, preferably, the reinforcement has a contact surface to come into contact with the substrate main surface, and a noncontact surface located on a side opposite the contact surface. This allows the reinforcement to be surface-bonded to the resin wiring substrate, thereby enhancing rigidity of the wiring substrate with a reinforcement and thus improving handleability of the wiring substrate with a reinforcement.

No particular limitation is imposed on a method of bonding the reinforcement to the substrate main surface of the resin wiring substrate. A known bonding method can be employed according to conditions of the reinforcement, such as properties of a material used to form the reinforcement and the shape of the reinforcement. For example, preferably, the contact surface of the reinforcement is bonded to the substrate main surface via adhesive. This method can reliably and easily bond the reinforcement to the resin wiring substrate. Examples of adhesive include an acrylic adhesive, an epoxy adhesive, a cyanoacrylate adhesive, and a rubber adhesive.

In the case where the reinforcement has a contact surface to come into contact with the substrate main surface, and a noncontact surface located on a side opposite the contact surface, at least one of the contact surface and the noncontact surface may be clad with a metal foil. Cladding with a metal foil can impart higher rigidity to the reinforcement. Also, stagnant heat in the opening portion of the reinforcement can be released via the metal foil. Examples of metal used to form the metal foil include silver, gold, platinum, copper, titanium, aluminum, palladium, nickel, and tungsten. Preferably, the metal foil is formed of copper. As compared with a foil of any other metal, a foil of copper is low in resistance and exhibits improved heat radiation and electric conductivity.

Preferably, an inner wall surface of the opening portion of the reinforcement is roughened, and an underfill material can be charged into the opening portion. Through employment of this structural feature, the underfill material sealingly fills clearance between the resin wiring substrate and a chip component connected to a plurality of main-surface-side connection terminals exposed in the opening portion. Further, since the inner wall surface of the opening portion is roughened, adhesive strength between the reinforcement and the underfill material is enhanced. Thus, the chip component can be stably supported by the resin wiring substrate. Further, preferably, a region of the substrate main surface of the resin wiring substrate which is exposed from the opening portion is roughened. Through employment of this structural feature, in addition to enhancement of adhesive strength between the reinforcement and the underfill material, adhesive strength between the resin wiring substrate and the underfill material is enhanced. Thus, the chip component can be stably supported by the resin wiring substrate.

When cracking occurs in a boundary region between the reinforcement and the underfill material, warpage of the resin wiring substrate conceivably occurs due to release of stress. Thus, the underfill material may be charged into clearance between the chip component and the resin wiring substrate and into clearance between the chip component and the reinforcement and may further be charged in such a manner as to cover a surface of the chip component located on a side toward the noncontact surface. Such a manner of charging the underfill material increases the contact area between the reinforcement and the underfill material, thereby enhancing adhesive strength therebetween. Thus, the occurrence of cracking in the boundary region between the reinforcement and the underfill material can be restrained. As a result, since warpage of the resin wiring substrate, which could otherwise result from release of stress, can be restrained, breakage of a chip component stemming from warpage of the resin wiring substrate can be prevented.

Preferred examples of the underfill material include epoxy resin, phenol resin, urethane resin, silicone resin, and polyimide resin. Preferably, the resin wiring substrate, the reinforcement, and the underfill material are formed of respective resin materials of substantially the same composition. Through employment of substantially the same composition, adhesive strength among the resin wiring substrate, the reinforcement, and the underfill material is enhanced. Also, since a difference in thermal expansion coefficient among the resin wiring substrate, the reinforcement, and the underfill material becomes small, the occurrence of a defect caused by warpage or the like of the resin wiring substrate is prevented. Therefore, the reliability of the wiring substrate with a reinforcement is further improved.

Other features and advantages of the invention will be set forth in, or apparent from, the detailed description of exemplary embodiments of the invention found below.

DETAIL DESCRIPTION OF EXEMPLARY EMBODIMENTS OF THE INVENTION

An exemplary embodiment of the present invention will next be described in detail with reference to the drawings.

Figure 1:
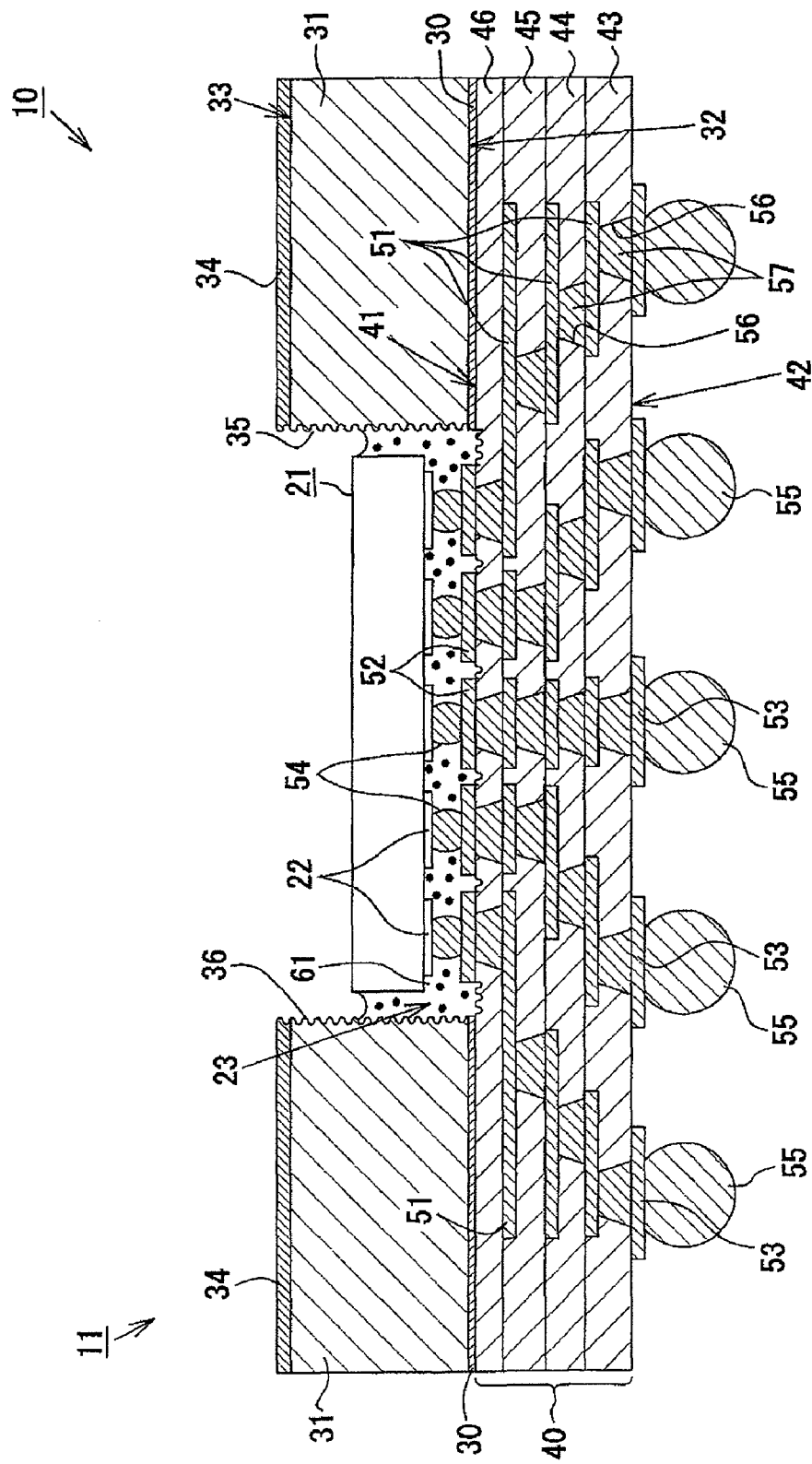
FIG. 1 is a schematic sectional view of an exemplary semiconductor package according to an embodiment of the present invention.
Figure 2:
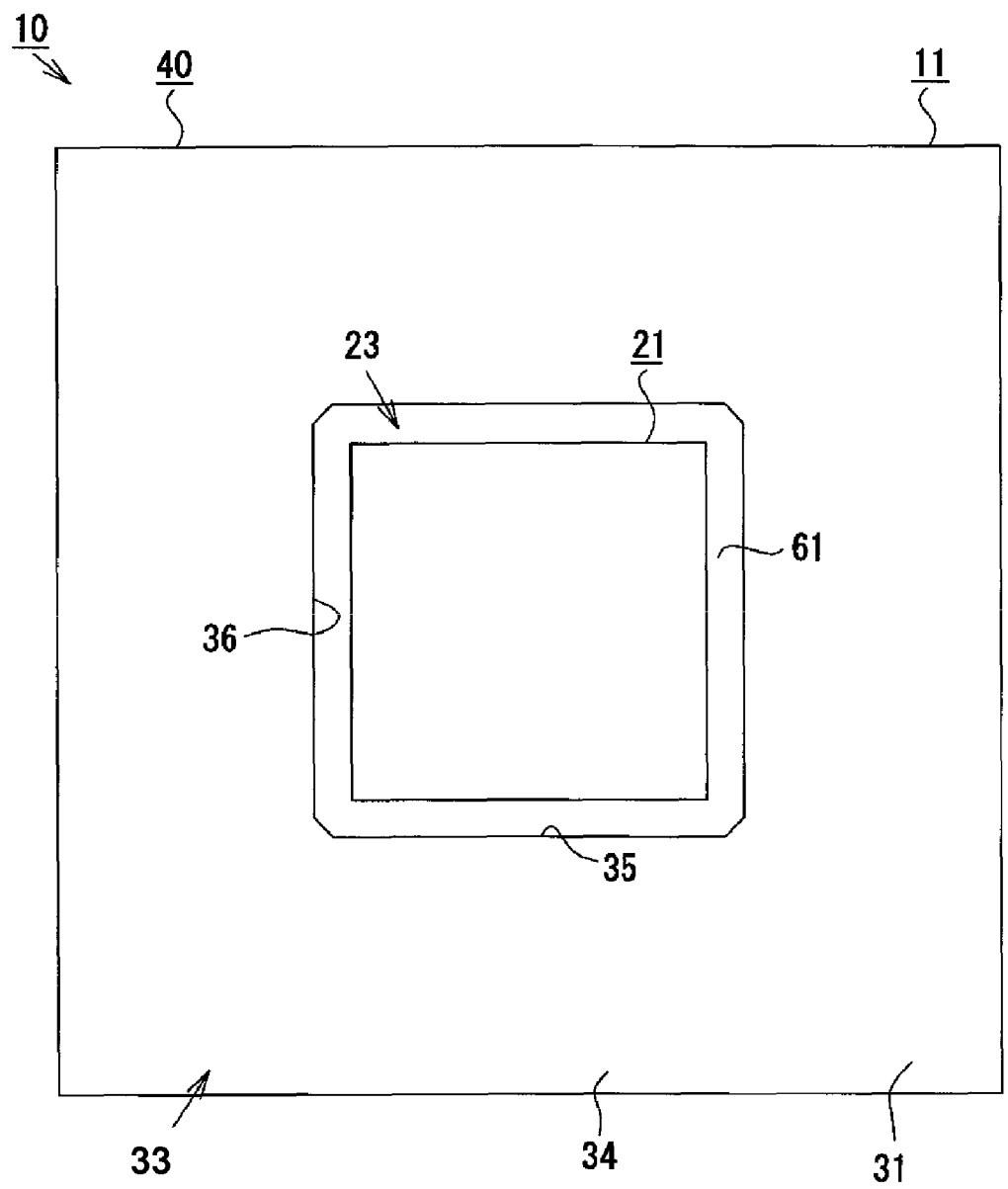
FIG. 2 is a schematic plan view of the exemplary semiconductor package of FIG. 1.
Figure 3:
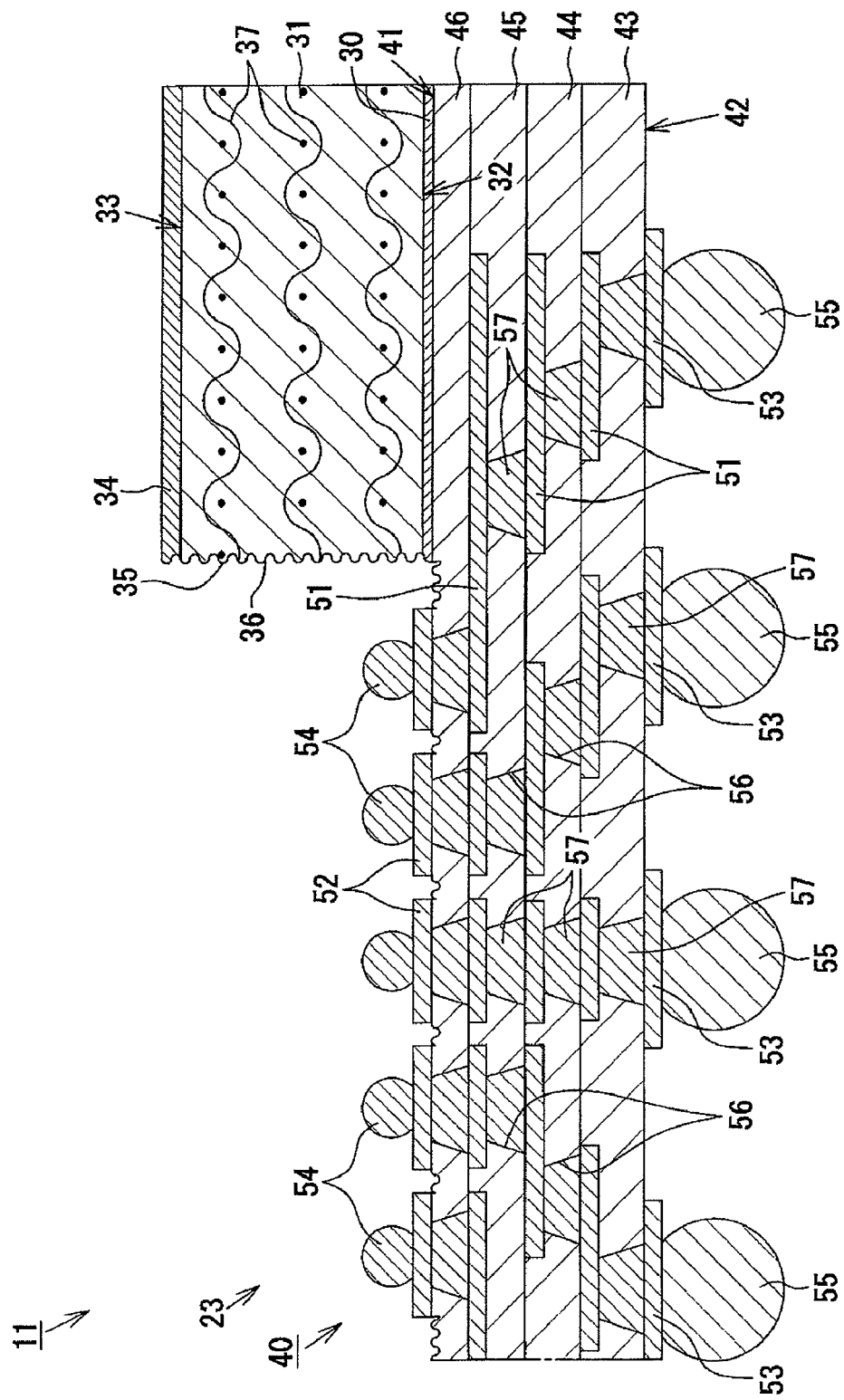
FIG. 3 is a sectional view of essential portions of an exemplary wiring substrate with a stiffener.

As shown in FIGS. 1 to 3, a semiconductor package 10 of the present embodiment is a ball grid array (BGA) semiconductor package which includes a wiring substrate 11 with a stiffener (a wiring substrate with a reinforcement) and an IC chip 21 (chip component), which is a semiconductor integrated circuit device. The form of the semiconductor package 10 is not limited to BGA, but may be, for example, a pin grid array (PGA) or a land grid array (LGA). The IC chip 21 has the form of a square flat plate measuring 15.0 mm×15.0 mm×0.8 mm (thickness) and is formed of silicon having a thermal expansion coefficient of 4.2 ppm/° C.

The wiring substrate 11 with a stiffener includes a resin wiring substrate 40 and a wiring substrate stiffener (hereinafter referred to as the "stiffener") 31. The resin wiring substrate 40 of the present embodiment has a square shape measuring 50.0 mm×50.0 mm×0.4 mm (thickness). The resin wiring substrate 40 does not have a core substrate, and has a structure in which four resin insulation layers 43, 44, 45, and 46 formed of epoxy resin and conductive layers 51 formed of copper are arranged in alternating layers. In the present embodiment, the resin insulation layers 43 to 46 have a thermal expansion coefficient of about 30 ppm/° C., and the conductive layers 51 have a thermal expansion coefficient of about 17 ppm/° C. The resin wiring substrate 40 has an overall thermal expansion coefficient of about 20 ppm/° C. Notably, the thermal expansion coefficient is the average of measurements in a temperature range of 0° C. to a glass transition temperature (Tg).

As shown in FIGS. 1 and 3, the resin wiring substrate 40 has terminal pads 52 (main-surface-side connection terminals) arrayed on a substrate main surface 41 (on the surface of the fourth resin insulation layer 46). Further, a plurality of main-surface-side solder bumps 54 are disposed on the surfaces of the respective terminal pads 52. The main-surface-side solder bumps 54 are electrically connected to respective surface connection terminals 22 of the IC chip 21. That is, the IC chip 21 is mounted on the substrate main surface 41 of the resin wiring substrate 40. A region in which the terminal pads 52 and the main-surface-side solder bumps 54 are formed is an IC chip mounting region 23 in which the IC chip 21 can be mounted.

Also, the resin wiring substrate 40 has BGA pads 53 (back-surface-side connection terminals) arrayed on a substrate back surface 42 (on the lower surface of the first resin insulation layer 43). A plurality of back-surface-side solder bumps 55 for connection to a motherboard are disposed on the surfaces of the respective BGA pads 53. By means of the back-surface-side solder bumps 55, the resin wiring substrate 40 can be mounted on a motherboard (not shown).

As shown in FIGS. 1 and 3, the resin insulation layers 43 to 46 have via holes 56 and via conductors 57 formed therein. The via holes 56 each have the shape of a truncated cone and are formed in the resin insulation layers 43 to 46 by use of a YAG laser or a carbon dioxide gas laser. Each of the via conductors 57 has a diameter which increases toward the substrate back surface 42 (downward in FIG. 1). The via conductors 57 electrically interconnect the conductive layers 51, the terminal pads 52, and the BGA pads 53.

As shown in FIGS. 1 to 3, the stiffener 31 has the form of a square frame measuring 50.0 mm×50.0 mm×2.0 mm (thickness). As shown in FIG. 3, the stiffener 31 is formed of a composite material prepared such that a resin material (in the present embodiment, epoxy resin) contains a sheet material of inorganic fiber (in the present embodiment, glass cloth 37). Since the stiffener 31 is formed thicker than the resin wiring substrate 40, the stiffener 31 is higher in rigidity than a resin material (in the present embodiment, epoxy resin) which partially constitutes the resin wiring substrate 40. Specifically, the Young's modulus of the stiffener 31 is set to about 50 GPa, which is higher than that (about 30 GPa) of the resin wiring substrate 40. Further, the thermal expansion coefficient of the stiffener 31 is set to about 16 ppm/° C., which is lower than that (about 20 ppm/° C.) of the resin wiring substrate 40. That is, in the present embodiment, the difference between the thermal expansion coefficient of the stiffener 31 and the thermal expansion coefficient of the resin wiring substrate 40 is about 4.0 ppm/° C.

As shown in FIGS. 1 and 3, the stiffener 31 has a contact surface 32 and a noncontact surface 33, which is located on a side opposite the contact surface 32. The contact surface 32 can come into contact with a peripheral region of the substrate main surface 41 (i.e., a region of the substrate main surface 41 other than the IC chip mounting region 23). The entire noncontact surface 33 is clad with a copper foil 34 (metal foil). In the present embodiment, the copper foil 34 has a thermal expansion coefficient of about 17 ppm/° C. Notably, the copper foil 34 is not electrically connected to the conductive layers 51, the terminal pads 52, the BGA pads 53, and the via conductors 57 and can thus be said to be a dummy conductive layer.

The stiffener 31 has an opening portion 35, which extends through the stiffener 31, has a square shape as viewed in plan, and opens at a central portion of the contact surface 32 and at a central portion of the noncontact surface 33. The opening portion 35 is adapted to expose the terminal pads 52 and the main-surface-side solder bumps 54 therefrom. Specifically, the opening portion 35 is a hole which has a substantially square cross section having four rounded corners each having a radius of 1.5 mm and measures 20 mm×20 mm.

As shown in FIGS. 1 and 3, the contact surface 32 of the stiffener 31 is surface-bonded (fixedly bonded) to a peripheral portion of the substrate main surface 41 via an adhesive 30. In the present embodiment, the adhesive 30 is an epoxy adhesive having a thermal expansion coefficient of about 20 ppm/° C.

An inner wall surface 36 of the opening portion 35, and a region of the substrate main surface 41 which is exposed from the opening portion 35, are roughened to a surface roughness Ra of about 0.4 μm. An underfill material 61 of epoxy resin is charged into the opening portion 35. Specifically, the underfill material 61 is charged into clearance between the IC chip 21 and the resin wiring substrate 40 and into clearance between the IC chip 21 and the stiffener 31. That is, the resin wiring substrate 40, the stiffener 31, and the underfill material 61 are formed of respective resin materials (epoxy resin materials) of substantially the same composition. In the present embodiment, the underfill material 61 has a thermal expansion coefficient of about 25 ppm/° C.

Next, a process of fabricating the wiring substrate 11 with a stiffener will be described.

Figure 4:
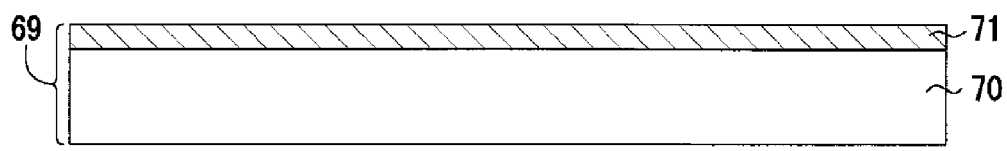
FIG. 4 is a sectional view of a base material in an exemplary process of fabricating a wiring substrate with a stiffener.
Figure 5:
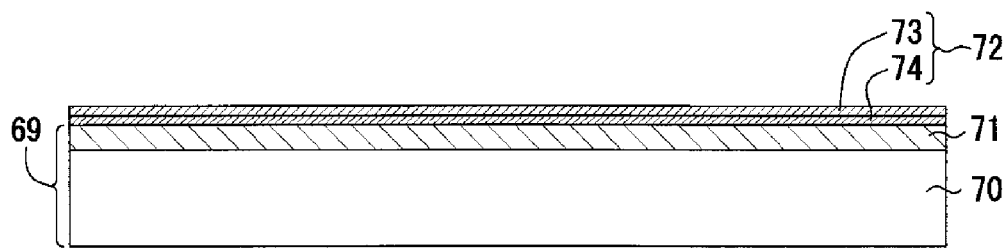
FIG. 5 is a sectional view of a metal laminate sheet disposed on the base material of FIG. 4, in the exemplary process of fabricating the wiring substrate with a stiffener.
Figure 13:
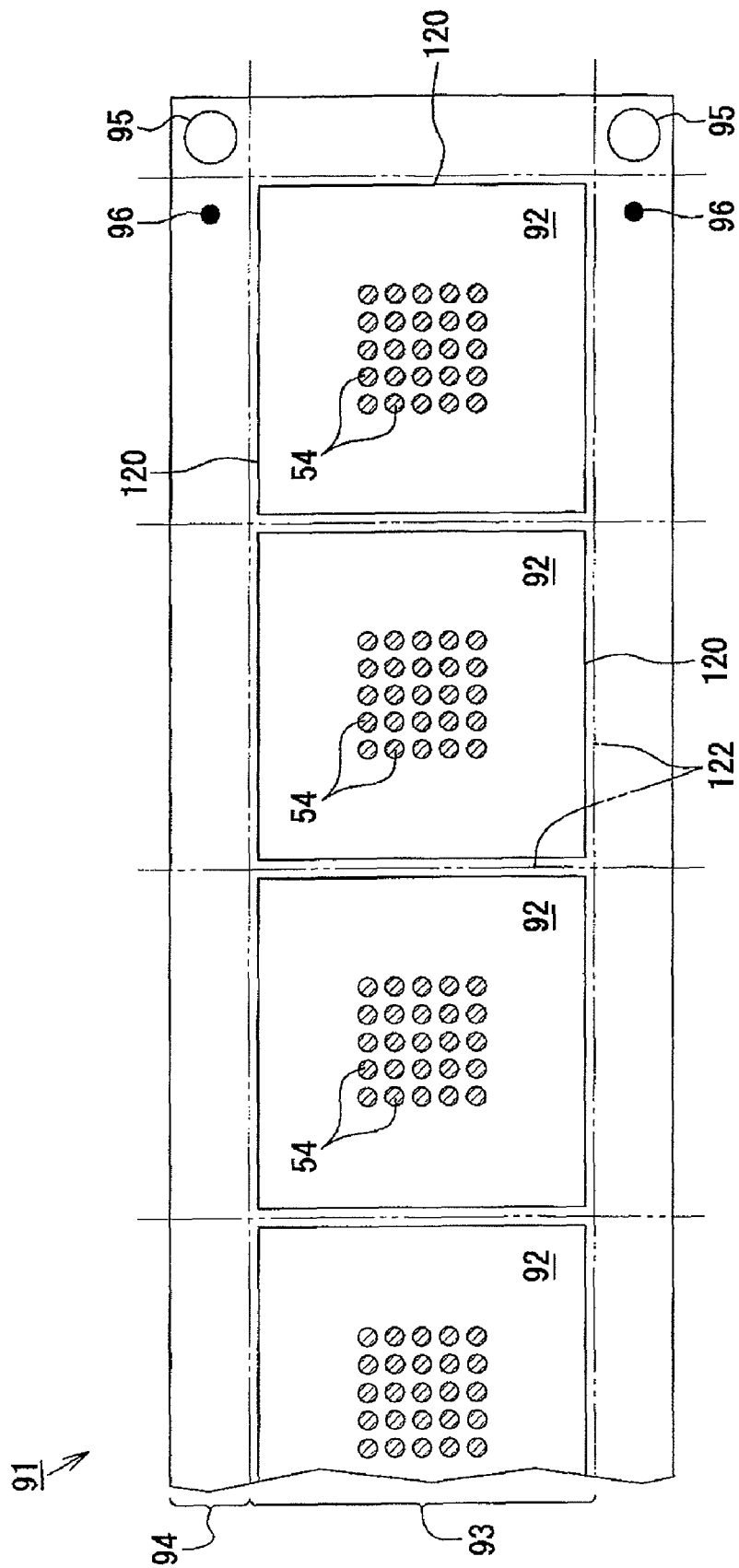
FIG. 13 is a schematic partial plan view of an exemplary multi-substrate panel.

In a substrate preparation step, a multi-substrate panel 91 shown in FIG. 13 is fabricated beforehand. The multi-substrate panel 91 is fabricated as follows. First, as shown in FIG. 4, a support substrate 70 having sufficient strength, such as a glass epoxy substrate, is prepared. A sheet-like resin insulation base material made of epoxy resin, which serves as a ground resin insulation layer 71, is attached onto the support substrate 70, thereby yielding a base material 69 consisting of the support substrate 70 and the ground resin insulation layer 71. Then, as shown in FIG. 5, a metal laminate sheet 72 is disposed on one side of the base material 69 (specifically, on the upper surface of the ground resin insulation layer 71). By disposing the metal laminate sheet 72 on the ground resin insulation layer 71, there is ensured such adhesion that, in the subsequent fabrication process, the metal laminate sheet 72 is not separated from the ground resin insulation layer 71. The metal laminate sheet 72 is configured such that two copper foils 73 and 74 are separably in close contact with each other. Specifically, the copper foils 73 and 74 are laminated together with metal plating (e.g., chromium plating) intervening therebetween, thereby forming the metal laminate sheet 72.

Figure 6:
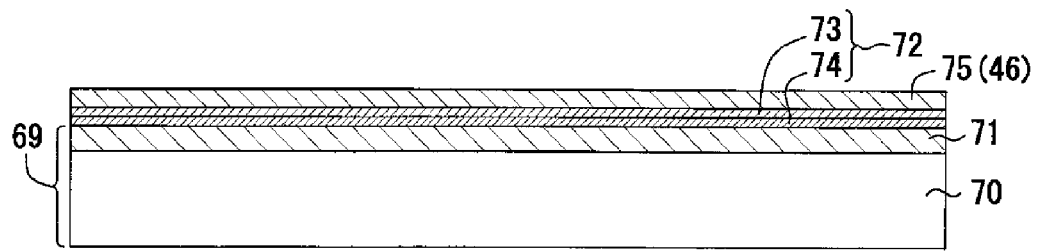
FIG. 6 is a sectional view of a resin insulation layer laminated on the metal laminate sheet of FIG. 5, in the exemplary process of fabricating the wiring substrate with a stiffener.
Figure 7:
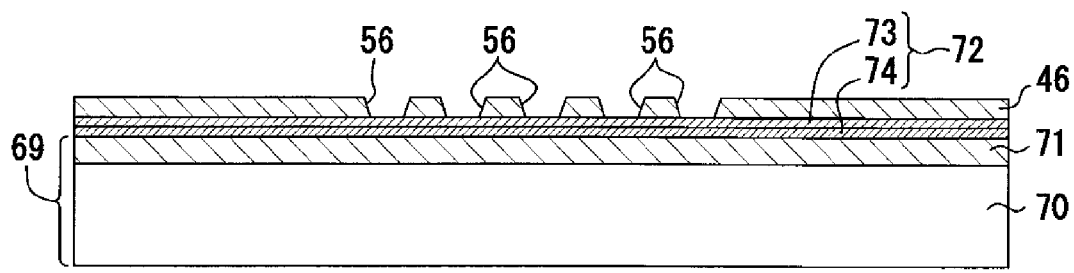
FIG. 7 is a sectional view of via holes formed in the resin insulation layer of FIG. 6, in the exemplary process of fabricating the wiring substrate with a stiffener.
Figure 8:
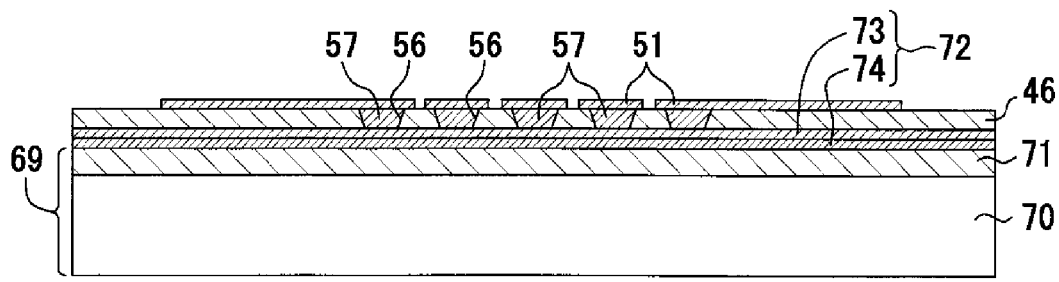
FIG. 8 is a sectional view of via conductors formed in the via holes and a conductive layer formed on the resin insulation layer of FIG. 7, in the exemplary process of fabricating the wiring substrate with a stiffener.

Subsequently, as shown in FIG. 6, a sheet-like resin insulation base material 75 is laminated on the metal laminate sheet 72, followed by application of heat under compression in a vacuum by use of a vacuum compression thermal press (not shown). This procedure cures the insulation resin base material 75, thereby forming the fourth resin insulation layer 46 (lamination step). Then, as shown in FIG. 7, the via holes 56 are formed in the resin insulation layer 46 at predetermined positions by means of laser beam machining. Next, desmear treatment is performed for removing smears from inside the via holes 56. Subsequently, electroless copper plating or copper electroplating is performed by a known process, thereby forming the via conductors 57 in the respective via holes 56. Further, etching is performed by a known process (e.g., semi-additive process), thereby forming the conductive layer 51 in a predetermined pattern on the resin insulation layer 46 (see FIG. 8).

Figure 9:
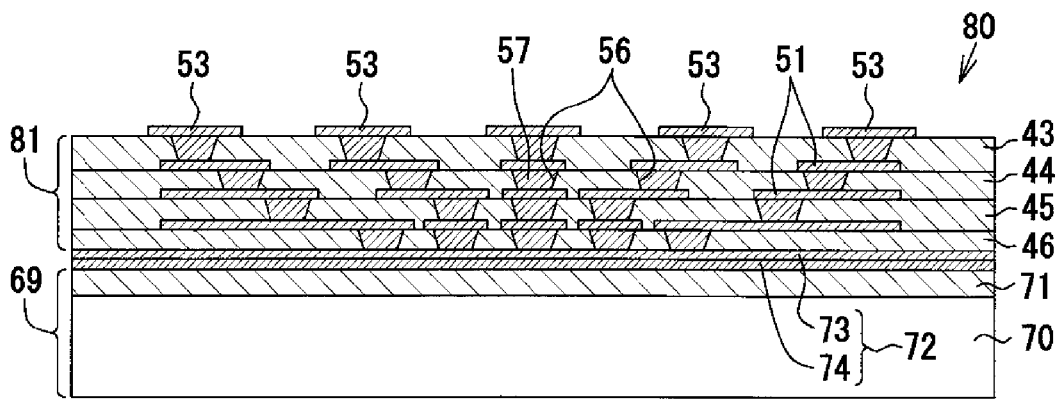
FIG. 9 is a sectional view of a wiring laminate portion formed on the metal laminate sheet of FIG. 5, in the exemplary process of fabricating the wiring substrate with a stiffener.

Also, the first to third resin insulation layers 43 to 45 and the other conductive layers 51 are formed in layers on the resin insulation layer 46 by processes similar to those used to form the fourth resin insulation layer 46 and the conductive layer 51. By the above-described fabrication process, there is formed a laminate 80 in which the metal laminate sheet 72, the resin insulation layers 43 to 46, and the conductive layers 51 are laminated on the support substrate 70 (see FIG. 9). As shown in FIG. 9, a portion of the laminate 80 which is located above the metal laminate sheet 72 is a wiring laminate portion 81 which will become the multi-substrate panel 91.

Figure 10:
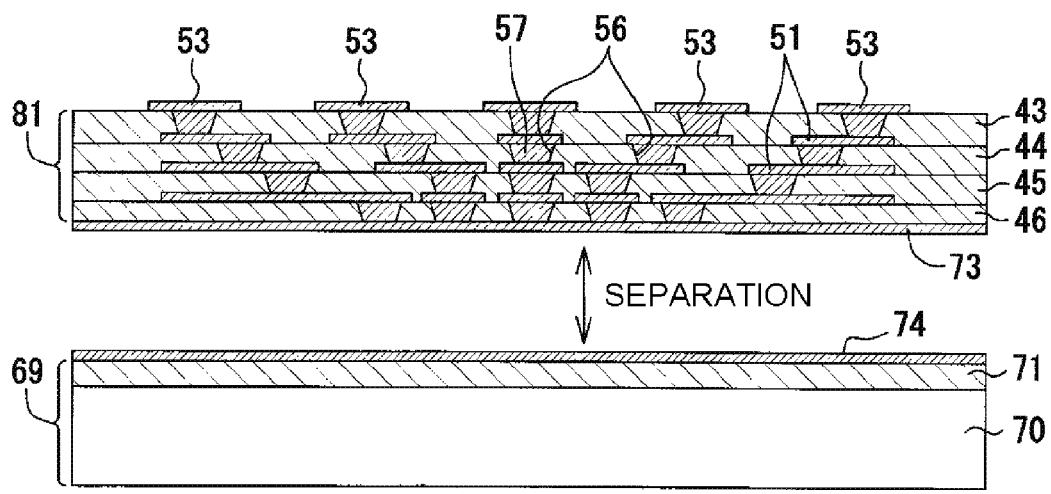
FIG. 10 is a sectional view of the base material and part of the metal laminate sheet separated from another part of the metal laminate sheet and the wiring laminate portion, in the exemplary process of fabricating the wiring substrate with a stiffener.

Next, the base material 69 is removed from the laminate 80, thereby exposing the copper foil 73 (base material removing step). Specifically, through separation at the interface between the two copper foils 73 and 74 of the metal laminate sheet 72, the wiring laminate portion 81 (multi-substrate panel 91) is separated from the support substrate 70 (see FIG. 10). As shown in FIG. 13, the multi-substrate panel 91 consists of a substrate formation portion 93 and a frame portion 94, which surrounds the substrate formation portion 93. In the substrate formation portion 93, a plurality of (in the present embodiment, five) square substrate formation regions 92, which will become the resin wiring substrates 40, are arranged in a planar direction. The frame portion 94 has circular guide holes 95 formed at its four corners.

Figure 11:
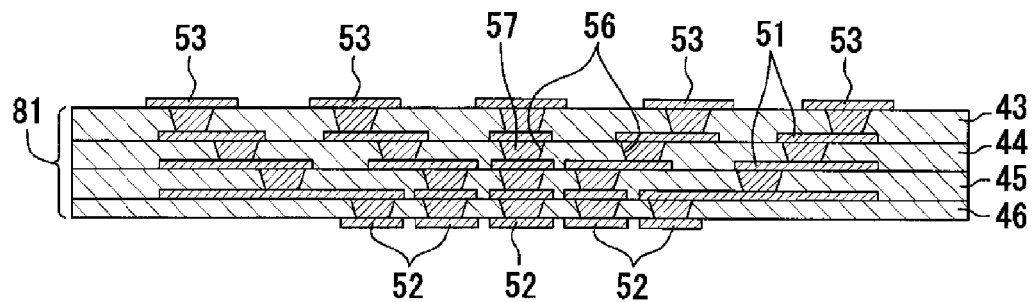
FIG. 11 is a sectional view of the wiring laminate portion of FIG. 10, including terminal pads formed on an outermost resin insulation layer, in the exemplary process of fabricating the wiring substrate with a stiffener.

As shown in FIG. 11, the copper foil 73 on the lower surface of the wiring laminate portion 81 (resin insulation layer 46) is subjected to patterning through etching, thereby forming the terminal pads 52 on the outermost resin insulation layer 46 in the substrate formation regions 92 (connection terminal forming step). Through patterning performed on the copper foil 73, circular alignment marks 96 (see FIG. 13) are formed at the four corners of the frame portion 94 in the vicinity of the guide holes 95.

Figure 12:
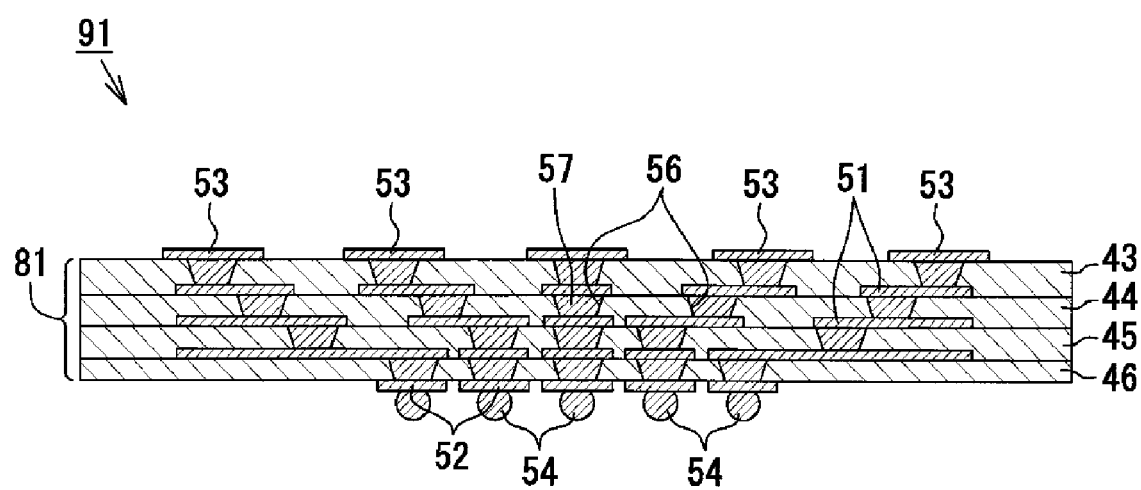
FIG. 12 is a sectional view of the wiring laminate portion of FIG. 11, including solder bumps formed on the terminal pads, in the exemplary process of fabricating the wiring substrate with a stiffener.

In the subsequent solder bump forming step, the main-surface-side solder bumps 54 for connection to an IC chip are formed on the plurality of respective terminal pads 52 formed on the outermost resin insulation layer 46 (see FIG. 12). Specifically, solder balls are disposed on the respective terminal pads 52 by use of an unillustrated ball mounting apparatus. Then, the solder balls are reflowed through application of heat at a predetermined temperature, thereby forming the main-surface-side solder bumps 54 on the respective terminal pads 52. Similarly, the back-surface-side solder bumps 55 are formed on the plurality of respective BGA pads 53 formed on the resin insulation layer 43.

Figure 14:
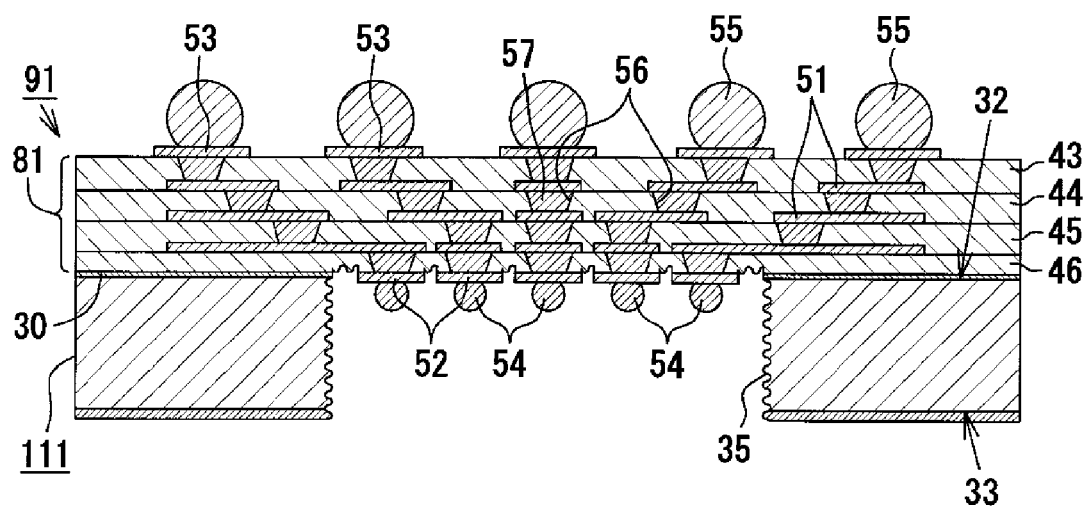
FIG. 14 is a sectional view of a multi-stiffener plate and the wiring laminate portion of FIG. 12, in the exemplary process of fabricating the wiring substrate with a stiffener.
Figure 15:
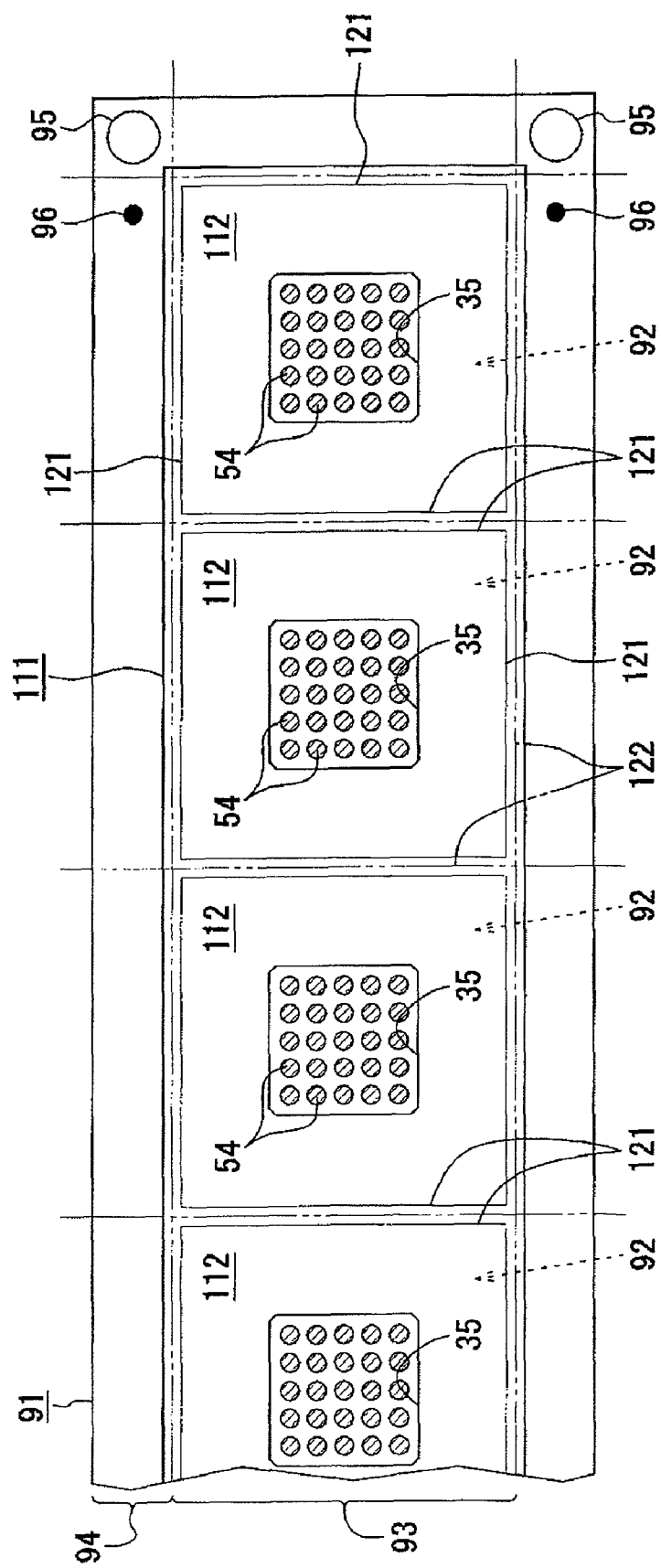
FIG. 15 is a schematic partial plan view of a structure in which a multi-stiffener plate is bonded to the exemplary multi-substrate panel of FIG. 13.

In a stiffener preparation step, a multi-stiffener plate 111 is prepared beforehand. As shown in FIGS. 14 and 15, the multi-stiffener plate 111 has the contact surface 32 and the noncontact surface 33 as well as a plurality of (in the present embodiment, five) square stiffener formation regions 112, which will become the stiffeners 31, arranged in a planar direction. The multi-stiffener plate 111 has a plurality of (in the present embodiment, five) the opening portions 35 prepared beforehand. The opening portions 35 are formed beforehand in the respective stiffeners 31 by cutting holes at predetermined positions by use of a spot facing tool, a mechanical drill, a punching apparatus, a YAG laser, a carbon dioxide gas laser, etc.

In the subsequent bonding step, while the multi-substrate panel 91 and the multi-stiffener plate 111 are positioned, the multi-stiffener plate 111 is bonded to the substrate main surface 41 of the multi-substrate panel 91. More specifically, first, the multi-substrate panel 91 is supported by a support member (not shown). At this time, guide pins (not shown) projecting from the support member are inserted into the respective guide holes 95, thereby positioning the multi-substrate panel 91 on the support member. A control unit (not shown) photographs the alignment marks 96 formed at the four corners of the frame portion 94 by use of a CCD camera (not shown) and detects the position of the multi-stiffener plate 111 to be bonded to the substrate main surface 41, on the basis of the positions of the photographed alignment marks 96. Next, the adhesive 30 is applied to the contact surface 32 of the multi-stiffener plate 111. On the basis of the detected position of the multi-stiffener plate 111, the multi-stiffener plate 111 is disposed on the substrate main surface 41, thereby bringing the contact surface 32 into contact with the substrate main surface 41. In this state, heat treatment (curing) is performed at, for example, about 150° C. so as to cure the adhesive 30. After the heat treatment, the adhesive 30 is cooled to the room temperature, and the multi-stiffener plate 111 is fixedly bonded to the substrate main surface 41 via the adhesive 30 (see FIG. 14). As shown in FIG. 15, the outside dimensions of the multi-stiffener plate 111 are set smaller than those of the multi-substrate panel 91 so that the guide holes 95 and the alignment marks 96 are visible. However, the outside dimensions of the multi-stiffener plate 111 are not limited to those of the present embodiment. For example, the outside dimensions of the multi-stiffener plate 111 may be set greater than or equal to those of the multi-substrate panel 91.

In the subsequent roughening step, simultaneous roughening is performed on the inner wall surfaces 36 of the opening portions 35 of the stiffeners 31 and on regions of the substrate main surfaces 41 which are exposed from the respective opening portions 35. Specifically, in the present embodiment, for roughening, a known roughening solution is applied to the inner wall surfaces 36 and the regions of the substrate main surfaces 41 which are exposed from the respective opening portions 35. Preferably, the roughening solution does not erode copper and solder. In place of application of roughening solution, sandblast may be performed for roughening. As a result, after the roughening step, the surface roughness Ra becomes about 0.4 μm.

In the subsequent substrate cutting step, the frame portion 94 is cut away from the substrate formation portion 93 by use of a known cutting apparatus or the like. Also, the multi-substrate panel 91 and the multi-stiffener plate 111 are cut along cutting lines 122 which are set along outlines 120 (see FIG. 13) of the substrate formation regions 92 and outlines 121 (see FIG. 15) of the stiffener formation regions 112. By this cutting procedure, there can be obtained a plurality of the wiring substrates 11 with a stiffener, each configured such that the cut end surfaces of the resin wiring substrate 40 and the cut end surfaces of the stiffener 31 are flush with each other (see FIG. 1). The cutting lines 122 for cutting the substrate formation regions 92 (the stiffener formation regions 112) from one another are set between the outlines 120 of the adjacent substrate formation regions 92 (the outlines 121 of the adjacent stiffener formation regions 112). The cutting lines 122 for separating the frame portion 94 from the substrate formation portion 93 are set in the boundary region between the substrate formation portion 93 and the frame portion 94.

Subsequently, the IC chip 21 is mounted in the IC chip mounting region 23 of the resin wiring substrate 40. At this time, the surface connection terminals 22 of the IC chip 21 are brought in register with the corresponding main-surface-side solder bumps 54 of the resin wiring substrate 40. Then, the main-surface-side solder bumps 54 are reflowed through application of heat. By this procedure, the surface connection terminals 22 and the main-surface-side solder bumps 54 are bonded together, whereby the IC chip 21 is mounted on the resin wiring substrate 40. Subsequently, a thermosetting resin which will become the underfill material 61 is charged into the opening portion 35, followed by heat curing.

Thus, the present embodiment yields the effects described below.

(1) In accordance with the wiring substrate 11 with a stiffener of the present embodiment, the thermal expansion coefficient of the stiffener 31 (about 16 ppm/° C.) is close to the thermal expansion coefficient of the resin wiring substrate 40 (about 20 ppm/° C.). Thus, the difference in the thermal expansion coefficient of the stiffener 31 and the thermal expansion coefficient of the resin wiring substrate 40 is reduced, so that at the time of bonding of the stiffener 31 (at the time of cooling after heat treatment), warpage of the resin wiring substrate 40 is reliably restrained. As a result, the occurrence of a defect caused by warpage of the resin wiring substrate 40 is prevented, so that the reliability of the wiring substrate 11 with a stiffener is improved. Further, since, by virtue of restraining the warpage of the resin wiring substrate 40, flatness of the substrate back surface 42 is also improved, such that the semiconductor package 10 can be reliably mounted on a motherboard.

(2) In the present embodiment, the stiffener 31 contains the glass cloth 37. Thus, even though the stiffener 31 is formed of epoxy resin, whose strength is lower than that of a metal material, the strength of the stiffener 31 can be enhanced. Thus, bonding the stiffener 31 to the resin wiring substrate 40 enhances the rigidity of the wiring substrate 11 with a stiffener, so that handleability of the wiring substrate 11 with a stiffener is improved.

Additional exemplary embodiments and modifications of the present embodiment are described below.

Figure 16:
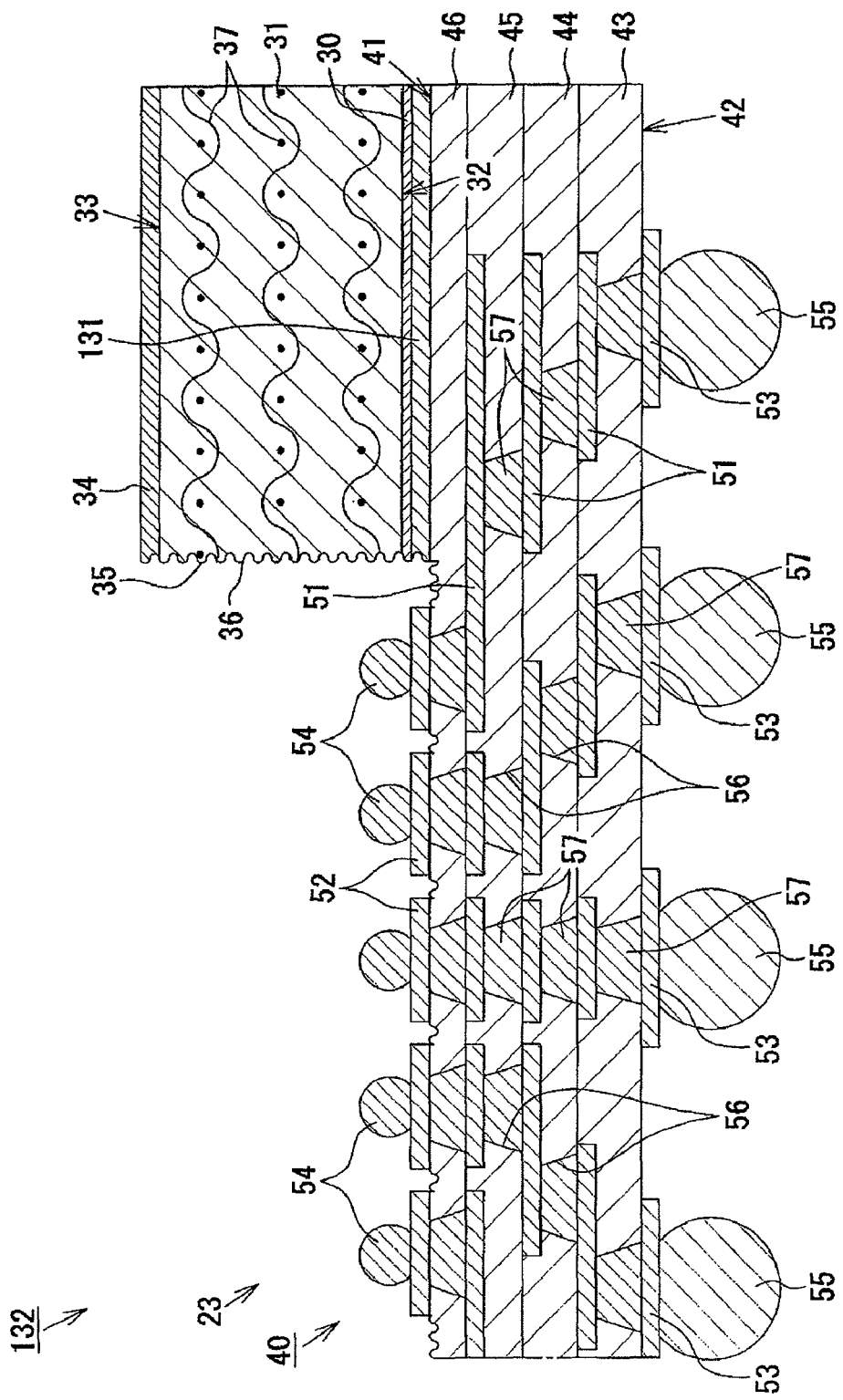
FIG. 16 is a sectional view of essential portions of an exemplary wiring substrate with a stiffener according to another embodiment of the present invention.

As shown in FIG. 16, a metal layer 131 may be formed in a region of the substrate main surface 41 which is in contact with the contact surface 32 of the stiffener 31, thereby forming a wiring substrate 132 with a stiffener. The formation of the metal layer 131 enhances adhesive strength between the stiffener 31 and the resin wiring substrate 40, so that the reliability of the wiring substrate 132 with a stiffener is improved. The metal layer 131 is formed through patterning performed on the copper foil 73 in the connection terminal forming step.

The stiffener 31 of the above-described embodiment is formed of a composite material prepared such that epoxy resin contains the glass cloth 37. However, a copper clad laminate prepared in the following manner may be used as a stiffener: a base material is prepared such that epoxy resin contains glass cloth, and one side of the base material is clad with copper foil.

In the stiffener 31 of the above-described embodiment, only the noncontact surface 33 is clad with the copper foil 34. However, only the contact surface 32 may be clad with the copper foil 34, or both of the contact surface 32 and the noncontact surface 33 may be clad with the copper foil 34. Also, the copper foil 34 may be provided within the stiffener 31.

In the above-described embodiment, patterning through etching is performed on the copper foil 73, thereby forming the terminal pads 52 (see FIG. 11). However, the terminal pads 52 may be formed as follows: after the base material removing step, a metal foil removing step is performed for completely removing the copper foil 73 by means of etching; subsequently, etching is performed by a known process (e.g., semi-additive process) so as to form the terminal pads 52.

According to the above-described embodiment, in the roughening step, simultaneous roughening is performed on the inner wall surfaces 36 of the opening portions 35 of the stiffeners 31 and on regions of the substrate main surfaces 41 which are exposed from the respective opening portions 35. However, roughening the inner wall surfaces 36 and roughening the regions of the substrate main surfaces 41 which are exposed from the respective opening portions 35 may be performed at different timings. For example, a substrate main surface roughening step may be performed at a timing after the connection terminal forming step and before the solder bump forming step, for roughening the regions of the substrate main surfaces 41 which are exposed from the respective opening portions 35, and an inner wall surface roughening step may be performed at a timing after the stiffener preparation step and before the bonding step, for roughening the inner wall surfaces 36. In the substrate main surface roughening step, in addition to the regions of the substrate main surfaces 41 which are exposed from the respective opening portions 35, the regions of the substrate main surfaces 41 to which the respective stiffeners 31 are to be bonded may be roughened.

The adhesive 30 used in the above-described embodiment is an epoxy-base adhesive. However, epoxy resin used to form the resin insulation layers 43 to 46 may be used as the adhesive.

In the above-described embodiment, an electronic component other than the IC chip 21 may be mounted on the substrate main surface 41 or the substrate back surface 42 of the resin wiring substrate 40. Examples of such an electronic component include a component having a plurality of terminals on its back surface or side surface (e.g., a transistor, a diode, a resistor, a chip capacitor, and a coil).

In the semiconductor package 10 of the above-described embodiment, the underfill material 61 is charged only into the clearance between the IC chip 21 and the resin wiring substrate 40 and the clearance between the IC chip 21 and the stiffener 31, and a surface 222 of an IC chip 221 located on a side toward a noncontact surface 233 is exposed. However, as in the case of a semiconductor package 210 shown in FIG. 17, in addition to charging an underfill material 261 into the clearance between the IC chip 221 and a resin wiring substrate 240 and into the clearance between the IC chip 221 and the stiffener 231, the surface 222 of the IC chip 221 may be covered completely with the underfill material 261. By this procedure, the volume of the underfill material 261 increases by the amount of the underfill material 261 covering the surface 222. Thus, the stiffener 231 is reliably reinforced by the underfill material 261. Further, the contact area between the stiffener 231 and the underfill material 261 increases, thereby enhancing adhesive strength therebetween. Thus, the occurrence of cracking in the boundary region between the stiffener 231 and the underfill material 261 can be restrained. As a result, since warpage of the resin wiring substrate 240, which could otherwise result from release of stress, can be restrained, breakage of the IC chip 221 stemming from warpage of the resin wiring substrate 240 can be prevented.

Figure 17:
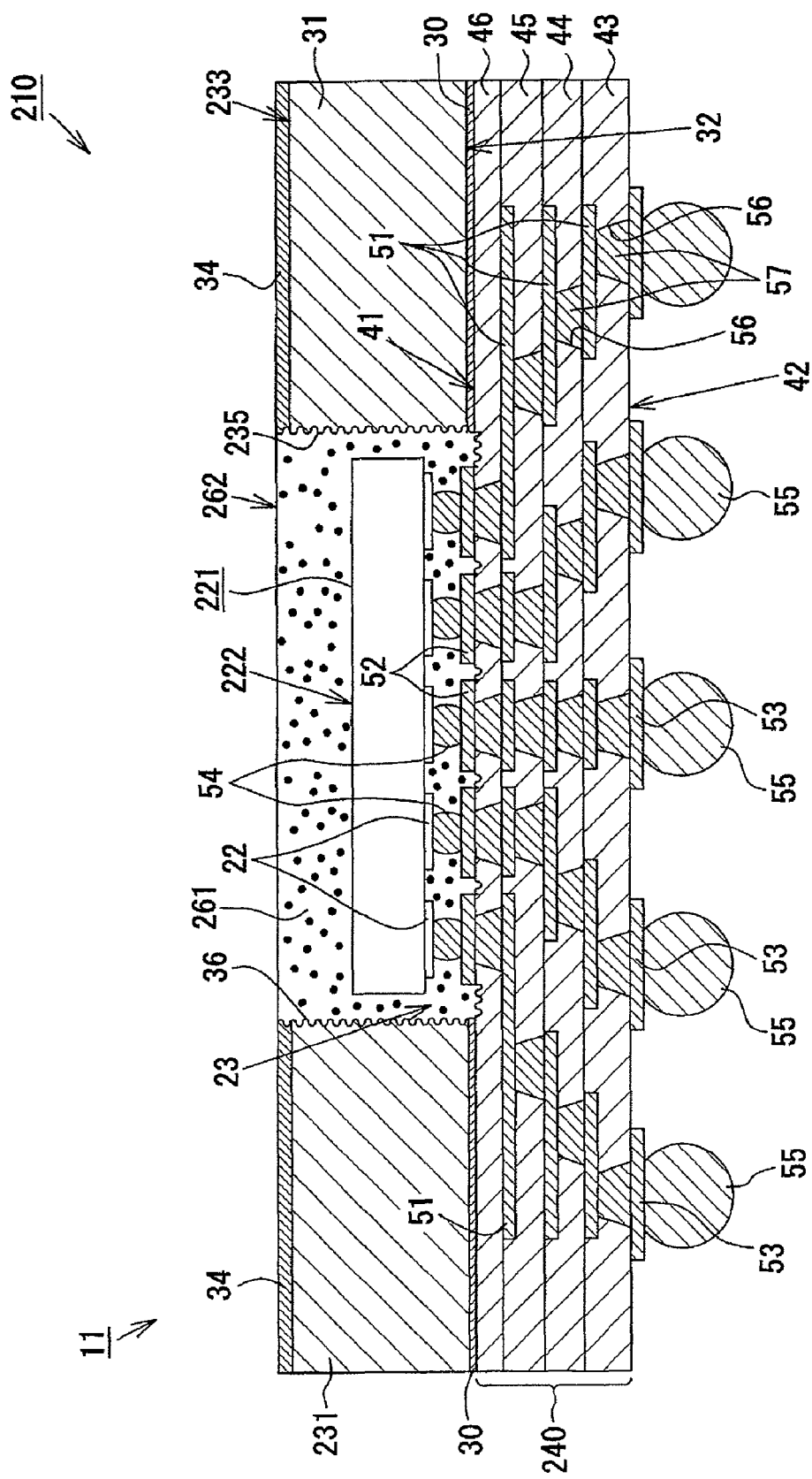
FIG. 17 is a schematic sectional view of an exemplary semiconductor package according to another embodiment of the present invention.
Figure 18:
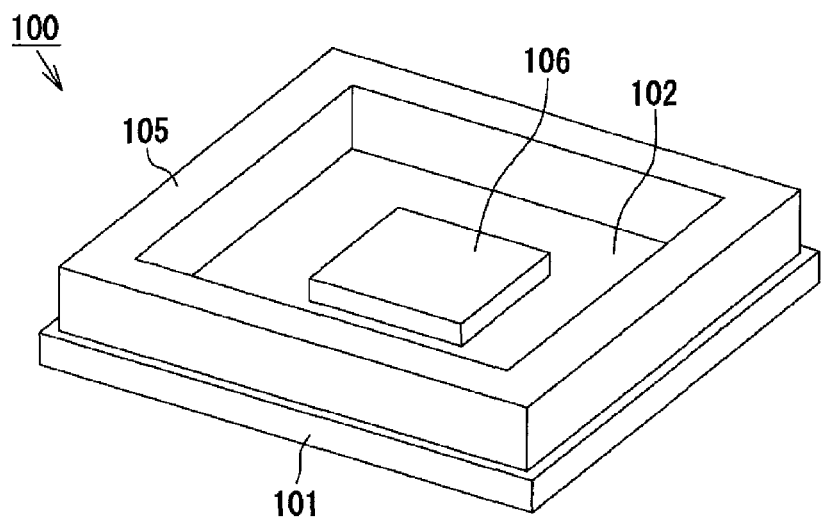
FIG. 18 is a schematic perspective view of a conventional semiconductor package.
Figure 19:
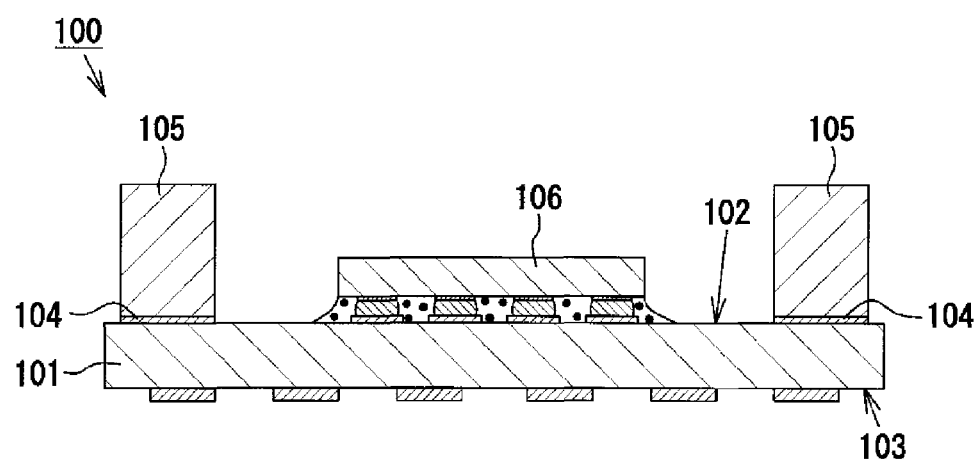
FIG. 19 is a schematic sectional view of the conventional semiconductor package of FIG. 18.

In the semiconductor package 210 shown in FIG. 17, an exposed surface 262 of the underfill material 261 which is exposed from an opening portion 235 is located at the same level as that of the noncontact surface 233. However, the exposed surface 262 of the underfill material 261 may be located above the level of the noncontact surface 233 of the stiffener 231. That is, a portion of the underfill material 261 may project from the noncontact surface 233 to the exterior of the opening portion 235. Also, the exposed surface 262 may be located below the level of the noncontact surface 233 (and above the level of the surface 222 of the IC chip 221).

When the exposed surface 262 of the underfill material 261 is to be located at the same level as that of the noncontact surface 233, a thermosetting resin which will become the underfill material 261 may be charged until it is at the same level as that of the noncontact surface 233, followed by heat curing. Alternatively, after the thermosetting resin is charged until it projects from the opening portion 235, and is then heat-cured, a projecting portion of the resin may be mechanically removed.

Next, technological ideas which the above-described embodiment implements are enumerated below.

(1) A wiring substrate with a reinforcement includes a resin wiring substrate and a reinforcement. The resin wiring substrate does not have a core substrate, and has a substrate main surface and a substrate back surface, a laminate structure of resin insulation layers and conductive layers, and a plurality of main-surface-side connection terminals which are disposed on the substrate main surface and to which a chip component is connectable. The reinforcement is bonded to the substrate main surface and has an opening portion extending through the reinforcement and adapted to expose the plurality of main-surface-side connection terminals therefrom. In the wiring substrate with a reinforcement, the reinforcement is formed of a composite material prepared such that a resin material contains an inorganic material; the reinforcement has a contact surface to come into contact with the substrate main surface, and a noncontact surface located on a side opposite the contact surface; at least one of the contact surface and the noncontact surface is clad with a metal foil; and the contact surface is bonded to the substrate main surface via adhesive.

(2) A wiring substrate with a reinforcement includes a resin wiring substrate and a reinforcement. The resin wiring substrate does not have a core substrate, and has a substrate main surface and a substrate back surface, a laminate structure of resin insulation layers and conductive layers, and a plurality of main-surface-side connection terminals which are disposed on the substrate main surface and to which a chip component is connectable. The reinforcement is bonded to the substrate main surface and has an opening portion extending through the reinforcement and adapted to expose the plurality of main-surface-side connection terminals therefrom. In the wiring substrate with a reinforcement, the reinforcement is formed of a composite material prepared such that a resin material contains an inorganic material; an inner wall surface of the opening portion is roughened to a surface roughness Ra of 0.3 µm to 0.8 µm inclusive; and an underfill material can be charged into the opening portion.

DESCRIPTION OF REFERENCE NUMERALS 11, 132: wiring substrate with a stiffener serving as a wiring substrate with a reinforcement
21, 221: IC chip serving as a chip component
31, 231: stiffener serving as a reinforcement
32: contact surface
33, 233: noncontact surface
34: copper foil serving as metal foil
35, 235: opening portion
36: inner wall surface of opening portion
37: glass cloth serving as an inorganic material and as a sheet material
40, 240: resin wiring substrate
41: substrate main surface
42: substrate back surface
43, 44, 45, 46: resin insulation layer
51: conductive layer
52: terminal pad serving as a main-surface-side connection terminal
53: BGA pad serving as a back-surface-side connection terminal
56: via hole serving as via
57: via conductor serving as via
61, 261: underfill material

What is claimed is:
1. A wiring substrate assembly comprising:
a resin wiring substrate not having a core substrate, and including a substrate main surface, a substrate back surface, a laminate structure comprised of resin insulation layers and conductive layers, and a plurality of connection terminals disposed on the substrate main surface, to which a chip component is connectable; and
a reinforcement member bonded to the substrate main surface and defining an opening portion extending through the reinforcement member so as to expose the plurality of connection terminals, the reinforcement member comprising a composite material including a resin material containing an inorganic material,
an inner wall surface of the opening portion being roughened, and
the opening portion being adapted to receive an underfill material.

2. A wiring substrate assembly according to claim 1, wherein the inorganic material comprises a sheet material of inorganic fiber.

3. A wiring substrate assembly according to claim 1, wherein a thermal expansion coefficient of the reinforcement member differs from a thermal expansion coefficient of the resin wiring substrate by 0 ppm/° C. to 10.0 ppm/° C. inclusive.

4. A wiring substrate assembly according to claim 1, wherein:
the reinforcement member has a contact surface in contact with the substrate main surface, and a noncontact surface located on a side opposite the contact surface, and
at least one of the contact surface and the noncontact surface is clad with a metal foil.

5. A wiring substrate assembly according to claim 1, wherein a region of the substrate main surface which is exposed from the opening portion is roughened.

6. A wiring substrate assembly according to claim 1, wherein the resin wiring substrate, the reinforcement member, and the underfill material are formed of respective resin materials of substantially the same composition.

7. A wiring substrate assembly according to claim 1, further comprising:
further connection terminals for connection to a motherboard are disposed on the substrate back surface, and
vias provided in the resin insulation layers, each of the vias having a diameter which increases toward the substrate back surface.

8. A semiconductor device comprising:
a resin wiring substrate not having a core substrate, and including a substrate main surface, a substrate back surface, a laminate structure comprised of resin insulation layers and conductive layers, and a plurality of connection terminals disposed on the substrate main surface;
a reinforcement member bonded to the substrate main surface and defining an opening portion extending through the reinforcement so as to expose the plurality of connection terminals; and
a chip component connected to the connection terminals, the reinforcement member comprising a composite material including a resin material containing an inorganic material;
a region of the substrate main surface of the resin wiring substrate which is exposed from the opening portion being roughened; and
an underfill material being charged into the opening portion.

9. A semiconductor device according to claim 8, wherein the inorganic material comprises a sheet material of inorganic fiber.

10. A semiconductor device according to claim 8, wherein a thermal expansion coefficient of the reinforcement member differs from a thermal expansion coefficient of the resin wiring substrate by 0 ppm/° C. to 10.0 ppm/° C. inclusive.

11. A semiconductor device according to claim 8, wherein:
the reinforcement member has a contact surface in contact with the substrate main surface, and a noncontact surface located on a side opposite the contact surface, and
at least one of the contact surface and the noncontact surface is clad with a metal foil.

12. A semiconductor device according to claim 8, further comprising:
further connection terminals for connection to a motherboard are disposed on the substrate back surface, and
vias provided in the resin insulation layers, each of the vias having a diameter which increases toward the substrate back surface.

13. A semiconductor device comprising:
a resin wiring substrate including a substrate main surface, a substrate back surface, a laminate structure comprised of resin insulation layers and conductive layers, and a plurality of connection terminals disposed on the substrate main surface;
a reinforcement member bonded to the substrate main surface and defining an opening portion extending through the reinforcement member so as to expose the plurality of connection terminals therefrom, an inner wall surface of the opening portion being roughened;
a chip component connected to the connection terminals; and
an underfill material charged into the opening portion.

14. A semiconductor device according to claim 13, wherein a region of the substrate main surface which is exposed from the opening portion is roughened.

15. A semiconductor device according to claim 13, wherein the resin wiring substrate, the reinforcement member, and the underfill material are formed of respective resin materials of substantially the same composition.

16. A semiconductor device according to claim 13, further comprising:
further connection terminals for connection to a motherboard are disposed on the substrate back surface, and
vias provided in the resin insulation layers, each of the vias having a diameter which increases toward the substrate back surface.

17. A semiconductor device according to claim 13, wherein the reinforcement member is comprised of a composite material including a resin material containing an inorganic material.

18. A semiconductor device according to claim 17, wherein the inorganic material comprises a sheet material of inorganic fiber.

19. A semiconductor device according to claim 13, wherein a thermal expansion coefficient of the reinforcement member differs from a thermal expansion coefficient of the resin wiring substrate by 0 ppm/° C. to 10.0 ppm/° C. inclusive.

20. A semiconductor device according to claim 14, wherein the underfill material is charged into a clearance between the chip component and the resin wiring substrate and into a clearance between the chip component and the reinforcement, and covers a surface of the chip component.

* * * * *